(12) United States Patent
Oohashi et al.

(10) Patent No.: US 7,718,007 B2
(45) Date of Patent: May 18, 2010

(54) SUBSTRATE SUPPORTING MEMBER AND SUBSTRATE PROCESSING APPARATUS

(75) Inventors: Kaoru Oohashi, Nirasaki (JP); Toshihiro Hayami, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 303 days.

(21) Appl. No.: 11/370,145

(22) Filed: Mar. 8, 2006

(65) Prior Publication Data

US 2006/0207507 A1    Sep. 21, 2006

Related U.S. Application Data

(60) Provisional application No. 60/665,360, filed on Mar. 28, 2005.

(30) Foreign Application Priority Data

Mar. 17, 2005    (JP) .............................. 2005-076555

(51) Int. Cl.
*C23C 16/00*    (2006.01)
*C23F 1/00*    (2006.01)
*H01L 21/306*    (2006.01)

(52) U.S. Cl. .................. 118/728; 156/345.51
(58) Field of Classification Search ................. 118/725, 118/728; 156/345.51
See application file for complete search history.

(56) References Cited

U.S. PATENT DOCUMENTS

| | | | |
|---|---|---|---|
| 4,990,169 A | * | 2/1991 | Broadbent ...................... 62/72 |
| 5,160,152 A | * | 11/1992 | Toraguchi et al. ............ 279/128 |
| 5,656,093 A | * | 8/1997 | Burkhart et al. ............. 118/728 |
| 5,841,624 A | * | 11/1998 | Xu et al. ...................... 361/234 |
| 2006/0076108 A1 | * | 4/2006 | Holland et al. ......... 156/345.27 |

FOREIGN PATENT DOCUMENTS

| | | | |
|---|---|---|---|
| JP | 1-313954 | | 12/1989 |
| JP | 4-211146 | | 8/1992 |
| JP | 7-18438 | | 1/1995 |
| JP | 07-018438 | * | 1/1995 |
| JP | 11-121600 | * | 4/1999 |
| WO | WO 01/84606 A1 | | 11/2001 |

OTHER PUBLICATIONS

Machine translation of JP 07-018438 to Hiroshi; Jan. 1995.*

* cited by examiner

*Primary Examiner*—Michael Cleveland
*Assistant Examiner*—Nathan K Ford
(74) *Attorney, Agent, or Firm*—Oblon, Spivak, McClelland, Maier & Neustadt, L.L.P.

(57) ABSTRACT

A substrate supporting member, and a substrate processing apparatus including the substrate supporting member are provided. The substrate supporting member for mounting and supporting a substrate on a substrate supporting surface thereof, and controlling a temperature of the substrate by thermal transfer between the substrate and the substrate supporting surface, wherein the substrate supporting surface is smaller than the substrate, and includes a central region, an intermediate region, and a peripheral region. A thermal conductivity between the substrate and the peripheral region is greater than that between the substrate and the central region which is greater than that between the substrate and the intermediate region located between the central region and the peripheral region.

12 Claims, 5 Drawing Sheets

SUBSTRATE SUPPORTING MEMBER AND SUBSTRATE PROCESSING APPARATUS

FIELD OF THE INVENTION

The present invention relates to a substrate supporting member for supporting a substrate mounted thereon, and a substrate processing apparatus including the substrate supporting member.

BACKGROUND OF THE INVENTION

In a manufacturing process of semiconductor devices, e.g., an etching process or a film forming process is performed by using a plasma.

The plasma processing using the plasma is generally performed by a plasma processing apparatus. The plasma processing apparatus includes, in a processing chamber, an upper electrode to which a high frequency power for generating the plasma is applied, a susceptor for supporting a substrate, and the like. Further, an inside of the processing chamber is depressurized to a predetermined pressure, and a processing gas is supplied into the processing chamber, and then, the high frequency power for generating the plasma is applied to the upper electrode to etch a film on the substrate by the plasma generated in the processing chamber.

Even when the plasma processing is performed under a high temperature condition to generate the plasma, it is required to constantly maintain a process condition in which the substrate is processed, e.g., a temperature of the substrate. On this account, the susceptor for supporting the substrate is temperature controlled, for example, by being provided with a circulating coolant to control the temperature of the substrate.

In case a top surface of the susceptor is smaller than that of the substrate, a peripheral portion of the substrate is outwardly extended beyond the top surface of the susceptor (for example, Japanese Patent Laid-open Application No. H11-121600). Consequently, it is prevented that the top surface of the susceptor is exposed to the upper electrode side to be etched by the plasma or the like during the etching process.

However, in case the peripheral portion of the substrate is extended beyond the susceptor as described above, during the process, a large amount of heat is applied to the peripheral portion of the substrate, and the peripheral portion of the substrate is not cooled sufficiently. On this account, the temperature of the substrate mounted on the susceptor becomes higher as a position on the substrate approaches the peripheral portion of the substrate, and thus, the in-surface temperature is not maintained uniformly. In case the temperature of the substrate surface is not uniform, for example, an in-surface etching uniformity is deteriorated, and thus, for example, a size of a line width of a central portion of the substrate becomes different from that of the peripheral portion.

SUMMARY OF THE INVENTION

It is, therefore, an object of the present invention to provide a substrate supporting member such as a susceptor for supporting a substrate and controlling a temperature of the substrate, by which the in-surface temperature of the substrate is uniformly maintained.

In accordance with an aspect of the present invention, there is provided a substrate supporting member for mounting and supporting a substrate on a substrate supporting surface thereof, and controlling a temperature of the substrate by thermal transfer between the substrate and the substrate supporting surface, wherein the substrate supporting surface is smaller than the substrate, and includes a central region, an intermediate region, and a peripheral region, and wherein a thermal conductivity between the substrate and the peripheral region is greater than that between the substrate and the central region which is greater than that between the substrate and the intermediate region located between the central region and the peripheral region.

In accordance with the present invention, the in-surface temperature of the substrate supported on the substrate supporting surface is uniformly maintained.

The intermediate region of the substrate supporting surface may correspond to an area ranging from 80% to 90% of a radius of the substrate from a center of the supported substrate.

The thermal conductivity between the substrate and each region of the substrate supporting surface may be controlled by changing a contact area therebetween.

A plurality of protruded portions for supporting the substrate is formed on the substrate supporting surface, and the thermal conductivities between the substrate and the substrate supporting surface may be controlled by changing the number of the protruded portions per unit area, or a contact area between each protruded portion and the substrate.

The thermal conductivity between the substrate and the substrate supporting surface may be controlled by changing a material constituting each region of the substrate supporting surface.

The thermal conductivity between the substrate and the substrate supporting surface may be controlled by changing a surface roughness of each region of the substrate supporting surface.

In accordance with another aspect of the present invention, there is provided a substrate processing apparatus including the above-described substrate supporting member.

In accordance with the present invention, the in-surface temperature of the substrate mounted on the substrate supporting member is uniformly maintained, and accordingly, an in-surface of the substrate is uniformly processed, and a production yield is improved.

BRIEF DESCRIPTION OF THE DRAWINGS

The above and other objects and features of the present invention will become apparent from the following description of preferred embodiment given in conjunction with the accompanying drawings, in which.

DETAILED DESCRIPTION OF THE PREFERRED EMBODIMENTS

Figure 1:
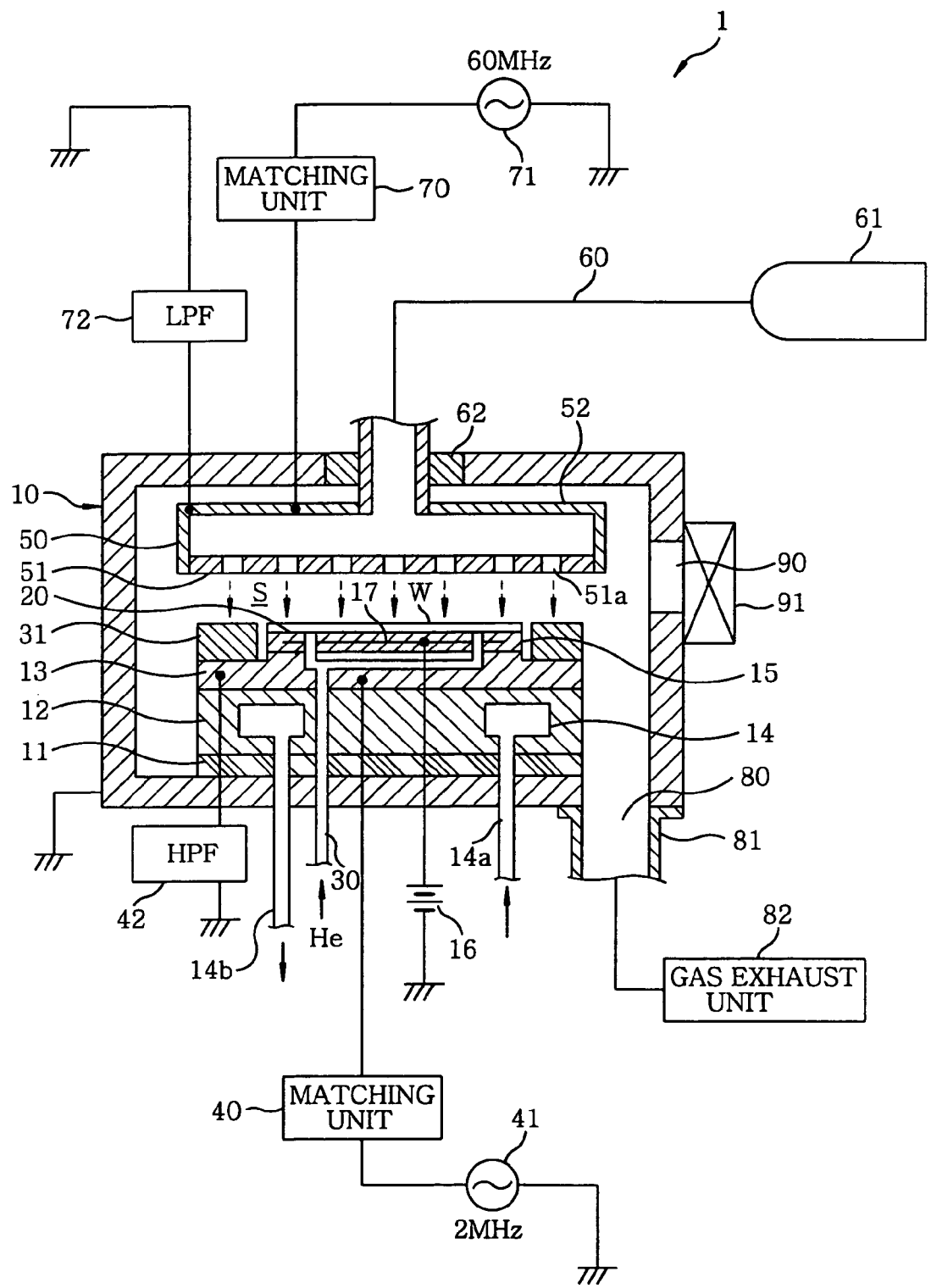
FIG. 1 offers a longitudinal cross sectional view for schematically showing a configuration of a plasma processing apparatus in accordance with the present invention.

Hereinafter, a preferred embodiment of the present invention will be described. FIG. 1 is a longitudinal cross sectional view for schematically showing a configuration of a parallel plate type plasma processing apparatus 1 including a substrate supporting member in accordance with the present invention.

The plasma processing apparatus 1 includes a processing vessel 10 of e.g. a substantially cylindrical shape, and a processing space S is formed in the processing vessel 10. The processing vessel 10 is made of, for example, an aluminum alloy, and an inner wall surface thereof is coated with an alumina film or an yttrium oxide film. Further, the processing vessel 10 is grounded.

There is provided a cylindrical susceptor supporting table 12 above a central bottom portion inside the processing vessel 10, with an insulating plate 11 being interposed between them. A susceptor 13 serving as the substrate supporting member for mounting and supporting a substrate W is supported on the susceptor supporting table 12. The susceptor 13 constitutes a lower electrode.

An annular coolant chamber 14 is formed in the susceptor supporting table 12. The coolant chamber 14 communicates with a chiller unit (not shown) installed outside the processing vessel 10, through lines 14a and 14b. A coolant is circulated and supplied to the coolant chamber 14 through the lines 14a and 14b, and accordingly, a temperature of the susceptor 13 is controlled. Accordingly, a temperature of the substrate W mounted on the susceptor 13 is controlled.

The susceptor 13 is made of, for example, the aluminum alloy such as the alumina ($Al_2O_3$). The susceptor 13 is generally formed as a disk-shape in which, for example, a central portion is protruded upward. An electrostatic chuck 15 constitutes a central protruding portion of the susceptor 13. In the electrostatic chuck 15, there is provided an electrode layer 17 connected to a DC power supply 16, and the substrate W can be adsorbed by applying DC voltage from the DC power supply 16 to the electrode layer 17 to generate a Coulomb force.

A substrate supporting surface 20 on which the substrate W is mounted is provided on a top surface of the electrostatic chuck 15 of the susceptor 13. The substrate supporting surface 20 is formed as a circular shape having a diameter less than that of, for example, the substrate W to be mounted. Accordingly, when the substrate W is mounted on the substrate supporting surface 20, a peripheral portion of the substrate W is outwardly extended beyond the periphery of the substrate supporting surface 20. The substrate supporting surface 20 includes a peripheral ring portion 21 formed along its periphery and a plurality of cylindrical protruded portions 22 as shown in, e.g., FIGS. 2 and 3. Top surfaces of the peripheral ring portion 21 and the protruded portions 22 have the same horizontal level, and they are formed to be flat, and contacted with the substrate W when the substrate W is mounted on the substrate supporting surface 20. Accordingly, the substrate W is supported by the peripheral ring portion 21 and the protruded portions 22 of the substrate supporting surface 20.

Figure 4:
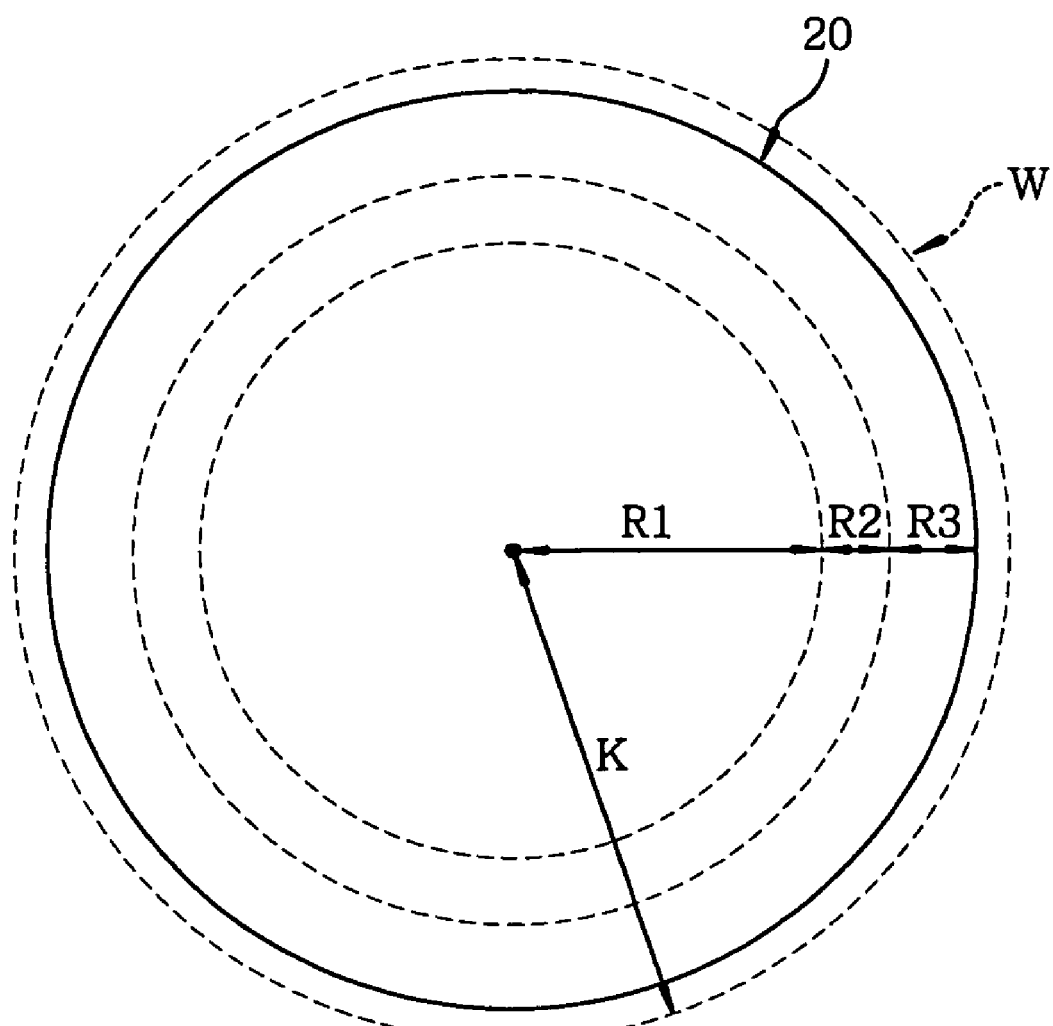
FIG. 4 depicts an exemplary diagram of the substrate supporting surface for illustrating regions of the substrate supporting surface.

The substrate supporting surface 20 is formed so that a thermal conductivity between the substrate W and the substrate supporting surface 20 is at first constant, and then decreased, and then increased from a central portion to the peripheral portion. For example, the substrate supporting surface 20 is partitioned into a central region R1 corresponding to an area ranging up to 80% of the radius K of the substrate W from a center of the mounted substrate W, an intermediate region R2 corresponding to the area ranging from 80% to 90% of the radius K of the substrate W therefrom, and a peripheral region R3 corresponding to the area ranging from 90% to 98% of the radius K of the substrate W therefrom. The thermal conductivity between the substrate W and the substrate supporting surface 20 is set for each of the regions R1 to R3 as shown in FIG. 4. Herein, the above-described thermal conductivity is an average thermal conductivity between each of the regions R1 to R3 and the substrate supporting surface 20.

Figure 2:
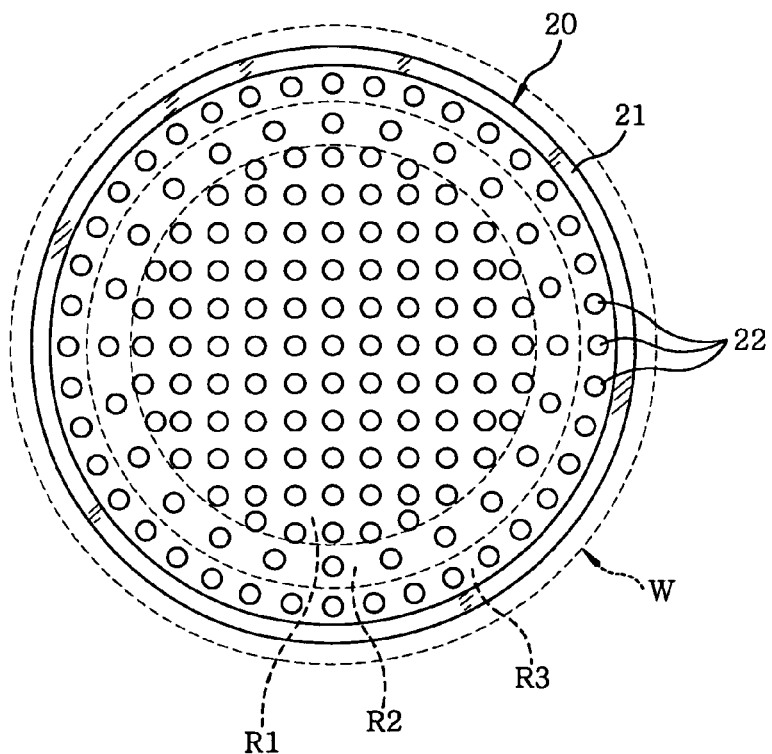
FIG. 2 shows a plane view of a substrate supporting surface in accordance with the present invention.
Figure 3:
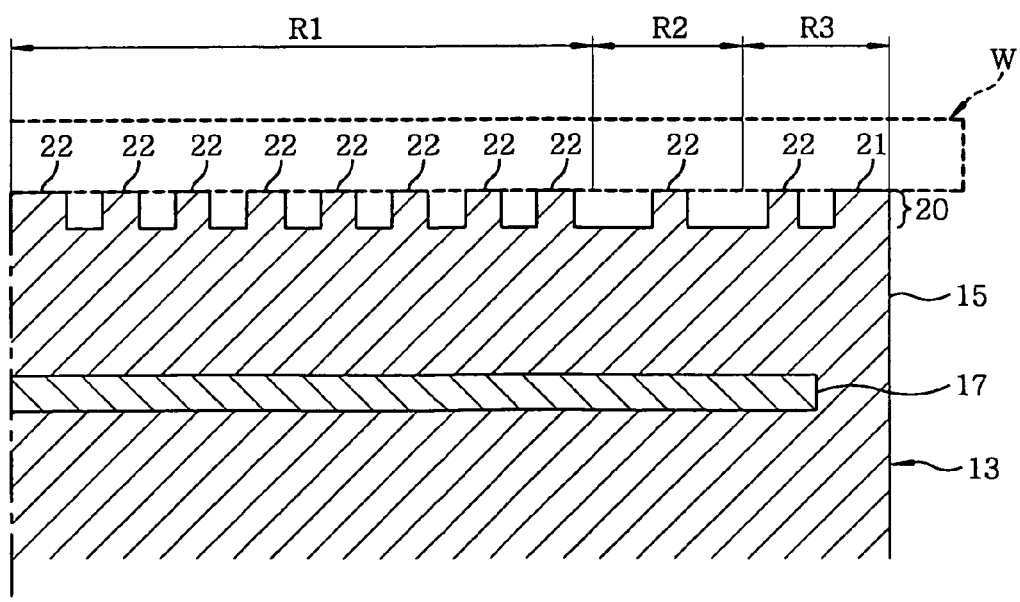
FIG. 3 is a longitudinal cross sectional view of an electrostatic chuck of a susceptor in accordance with the present invention.

A multiple number of protruded portions 22 are uniformly disposed on the central region R1 as shown in FIGS. 2 and 3, and an thermal conductivity corresponding to the central region R1 is constant between the central region R1 and the substrate W. A plural protruded portion 22 is formed so that its number on the intermediate region R2 per unit area is less than that on the central region R1. Accordingly, because a contact ratio between the protruded portions 22 and the substrate W (a contact area/a total area in a region) in the intermediate region R2 becomes less than that in the central region R1, the thermal conductivity between the intermediate region R2 and the substrate W becomes less than that between the central region R1 and the substrate W. Further, the thermal conductivity between the intermediate region R2 and the substrate W is set to be about 90% of that between the central region R1 and the substrate W.

A multiplicity of protruded portions 22 and the peripheral ring portion 21 are disposed on the peripheral region R3 so that the contact ratio in the peripheral region R3 is larger than that in the central region R1 or the intermediate region R2. The contact ratio can be increased, for example, by increasing the number of the protruded portions 22 per unit area or a width of the peripheral ring portion 21. Accordingly, the thermal conductivity between the substrate W and the peripheral region R3 is larger than that between the substrate W and the central region R1 or between the substrate W and the intermediate region R2.

Returning to FIG. 1, a gas supply line 30 passing through an inside of the susceptor 13 and the susceptor supporting table 12 is connected to the substrate supporting surface 20. Accordingly, a thermally conductive gas such as a He gas can be supplied to a space between the substrate W and the electrostatic chuck 15, formed when the substrate W is mounted on the substrate supporting surface 20.

An annular focus ring 31 is installed at a periphery of the susceptor 13 to surround the substrate W mounted on the susceptor 13. The focus ring 31 is made of, for example, a conductive material.

A first high frequency power supply 41 is electrically connected to the susceptor 13 via a matching unit 40. The first high frequency power supply 41 can output a high frequency power having a frequency ranging from 2 to 20 MHz, for example, 2 MHz to apply it to the susceptor 13. A self-bias potential for attracting ions in a plasma toward the substrate W can be generated by the first high frequency power supply 41.

A high pass filter 42 for passing a high frequency from a second high frequency power supply 71 connected to an upper electrode 50 described later to ground is electrically connected to the susceptor 13.

Besides, the upper electrode 50 is provided above the susceptor 13 to face the susceptor 13 in parallel. A plasma generation space is formed between the susceptor 13 and the upper electrode 50.

The upper electrode 50 constitutes a shower head for jetting a processing gas on the substrate W mounted onto the susceptor 13. The upper electrode 50 includes an electrode plate 51 facing, e.g., the susceptor 13, and an electrode supporting member 52 for supporting the electrode plate 51. The electrode supporting member 52 is formed substantially as, for example, a hollow cylindrical shape, and the electrode plate 51 is installed on its bottom. A plurality of gas injection openings 51a is formed on the electrode plate 51, and the processing gas introduced in the electrode supporting member 52 can be jetted therefrom.

One end of a gas supply line 60 for supplying the processing gas to the upper electrode 50 is connected to a central top surface of the electrode supporting member 52 of the upper electrode 50, and the other end thereof is connected to a gas supply source 61 through a top surface of the processing vessel 10. An insulating member 62 is interposed between the gas supply line 60 and the processing vessel 10.

The second high frequency power supply 71 is electrically connected to the upper electrode 50 via a matching unit 70. The second high frequency power supply 71 can output a high frequency power having a frequency greater than 40 MHz, for example, 60 MHz to apply it to the upper electrode 50. A plasma of the processing gas can be generated in the processing vessel 10 by the second high frequency power supply 71.

A low pass filter 72 for passing a high frequency from the first high frequency power supply 41 connected to the susceptor 13 to ground is electrically connected to the upper electrode 50.

A gas exhaust opening 80 is formed at a bottom portion of the processing vessel 10. The gas exhaust opening 80 is connected to a gas exhaust unit 82 including a vacuum pump or the like through a gas exhaust line 81. A pressure in the processing vessel 10 can be reduced to a desired level by the gas exhaust unit 82.

A transfer opening 90 for the substrate W is formed at a sidewall of the processing vessel 10, and the transfer opening 90 is provided with a gate valve 91. By opening the gate valve 91, the substrate W can be loaded into or unloaded from the processing vessel 10.

In an etching process performed by the plasma processing apparatus 1 configured as described above, the substrate W is first loaded into the processing vessel 10, and adsorptively mounted on the substrate supporting surface 20 of the susceptor 13. At this time, the temperature of the susceptor 13 is controlled to a predetermined level by the circulated coolant in advance. The temperature of the substrate W on the substrate supporting surface 20 is also controlled to a predetermined level by cooling transfer from the susceptor 13. Next, a pressure in the processing space S is reduced to a predetermined level by exhausting a gas through, for example, the gas exhaust line 81, and then, the processing gas is supplied into the processing space S through the upper electrode 50. The high frequency power is applied to the upper electrode 50 by the second high frequency power supply 71, and thus, the processing gas in the processing space S is turned into the plasma. Further the high frequency power is applied to the susceptor 13 by the first high frequency power supply 41, and thus, the charged particles in the plasma are pulled to the side of the substrate W. A film on the substrate W is etched by an action of the plasma.

Figure 5:
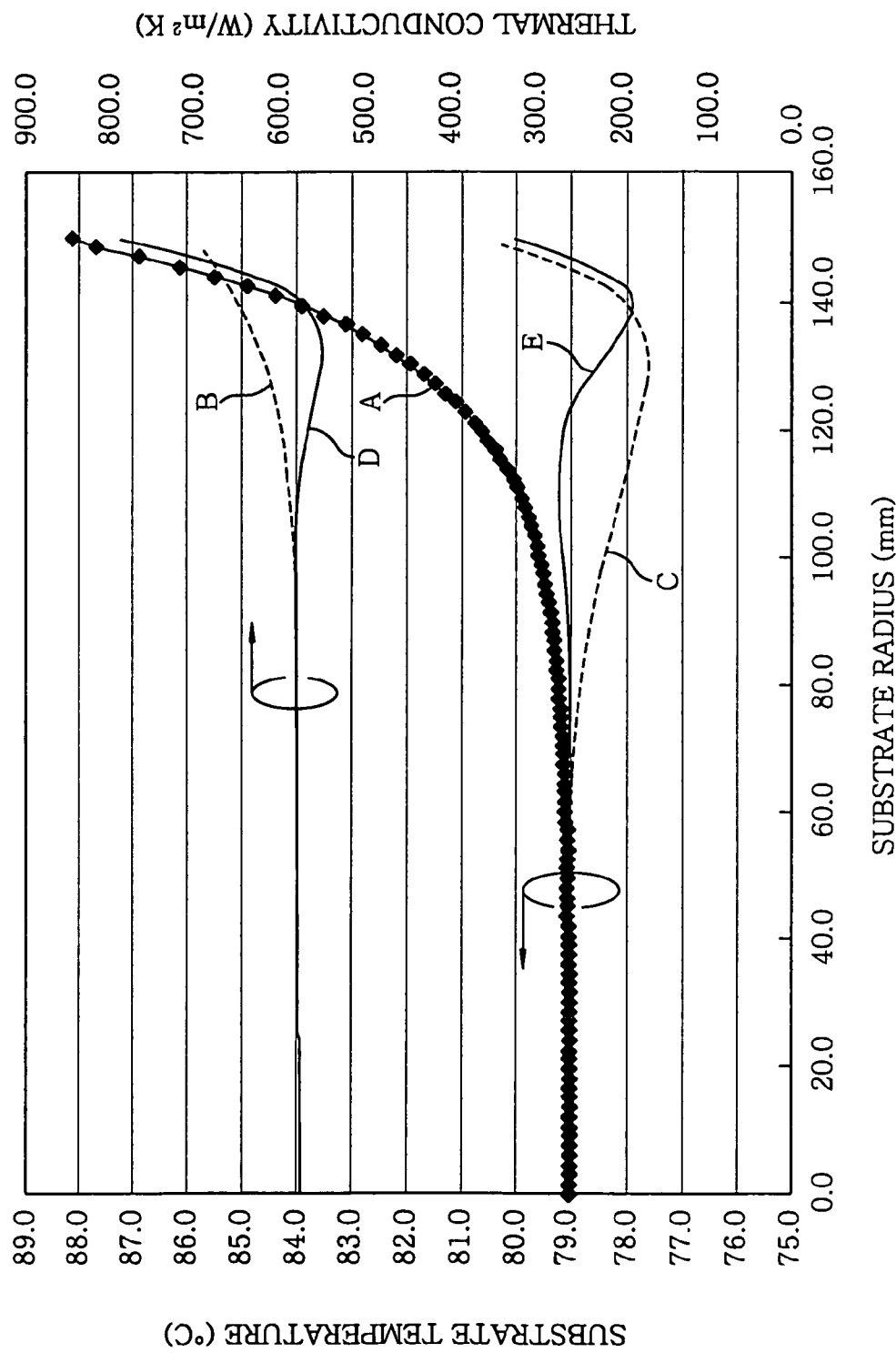
FIG. 5 presents a graph for presenting a thermal conductivity distribution of the substrate supporting surface and a temperature distribution of a substrate.

Hereinafter, a temperature uniformity of the substrate is verified in case of employing the susceptor 13 of the present preferred embodiment. FIG. 5 is a graph for presenting a thermal conductivity distribution between the substrate W and the substrate supporting surface 20, and a temperature distribution of the substrate W temperature controlled on the substrate supporting surface 20.

A curve A shown in FIG. 5 presents the temperature distribution of the substrate W in case the thermal conductivity between the substrate W on the susceptor 13 and the substrate supporting surface is uniform across the whole region. In this case, it can be shown that a temperature of the peripheral portion of the substrate W is notably increased. A curve B presents the thermal conductivity distribution in case the thermal conductivity between the substrate W and the substrate supporting surface is gradually increased from the central portion to the peripheral portion of the substrate supporting surface, and a curve C presents the temperature distribution of the substrate W in case of employing the thermal conductivity distribution of the curve B. In case of the curve C, although a temperature increase of the peripheral portion of the substrate W is suppressed when compared with the case of the curve A, a temperature of the substrate W is substantially decreased in a range from an intermediate portion to the peripheral portion.

A curve D presents the thermal conductivity distribution in case the thermal conductivity between the substrate W and the substrate supporting surface is increased in the order of the intermediate region R2<the central region R1<the peripheral region R3, as in the substrate supporting surface 20 of the susceptor 13 of the present preferred embodiment. A curve E presents the temperature distribution of the substrate W mounted on the substrate supporting surface 20 of the present preferred embodiment. In case of the curve E, the temperature decrease of the intermediate portion to the peripheral portion of the substrate W shown in the curve C is suppressed, and further, an in-surface maximum temperature difference is limited within a range of about ±1° C.

In accordance with the present preferred embodiment, because the thermal conductivity between the substrate W and the substrate supporting surface 20 is set so that it is increased in order of the intermediate region R2<the central region R1<the peripheral region R3 by changing the number of the protruded portions 22 of the substrate supporting surface 20 of the susceptor 13 per unit area, the in-surface temperature of the substrate W is uniformly maintained during the etching process in the plasma processing apparatus 1, and the etching process can be uniformly performed in the surface of the substrate.

Although the thermal conductivities between the substrate W and the respective regions R1 to R3 of the substrate supporting surface 20 are controlled by the number of the protruded portions 22 per unit area in accordance with the above-described preferred embodiment, the thermal conductivities between the substrate W and the respective regions R1 to R3 of the substrate supporting surface 20 may be controlled by changing the contact area between each of the protruded portions 22 and the substrate W, that is, an area of a top surfaces of each of the respective protruded portions 22, on the condition that a plurality of protruded portions 22 is uniformly disposed on the substrate supporting surface 20.

Figure 6:
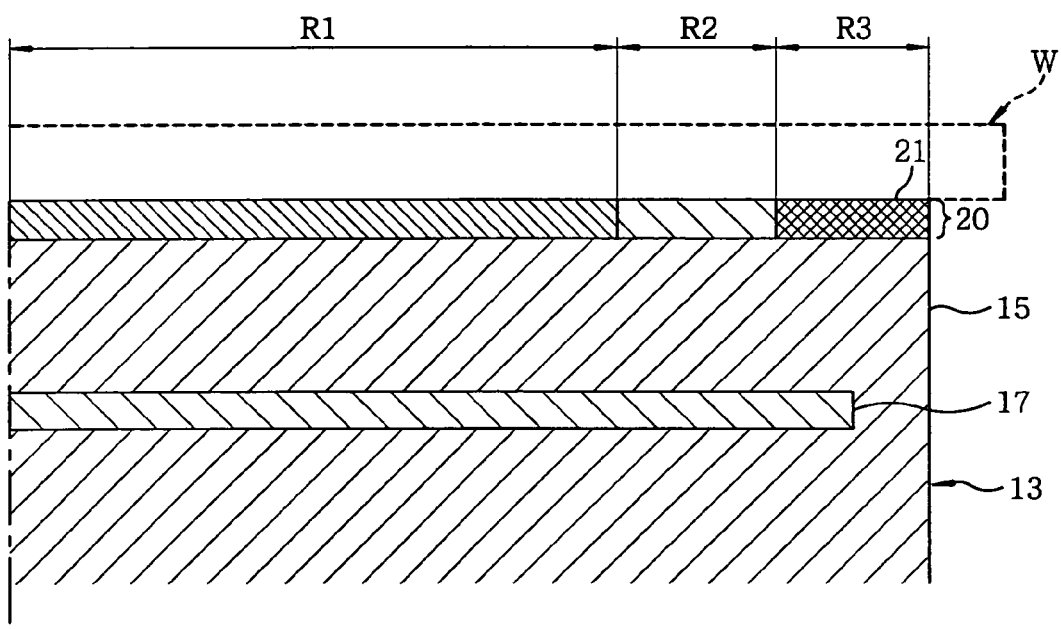
FIG. 6 is a longitudinal cross sectional view of the electrostatic chuck in case the substrate supporting surface has a flat top surface.

Further, the thermal conductivities between the substrate W and the respective regions R1 to R3 of the substrate supporting surface 20 may be controlled by changing materials of the respective regions R1 to R3. For example, in case the substrate supporting surface 20 is made of a material having the alumina as a principal component, the thermal conductivities of the respective regions R1 to R3 may be controlled by adding a different amount of aluminum nitride (AlN) to the material of the respective regions R1 to R3 of the substrate supporting surface 20. In this case, the amount of the added aluminum nitride is increased in order of the intermediate region R2, the central region R1, and the peripheral region R3, and thus, the thermal conductivity is set so that it is increased in order of the intermediate region R2, the central region R1, and the peripheral region R3. Further, in this case, the substrate supporting surface 20 may have a flat top surface without irregularity as shown in FIG. 6.

Further, the thermal conductivity of each of the regions R1 to R3 may be controlled by changing a surface roughness of each of the regions R1 to R3 of the substrate supporting surface 20. In this case, the substrate supporting surface 20 is formed so that the surface roughness is decreased in order of the intermediate region R2, the central region R1, and the peripheral region R3, and thus, the thermal conductivity is set so that it is increased in order of the intermediate region R2, the central region R1, and the peripheral region R3. Further, in this case, the substrate supporting surface 20 may also have a flat top surface without irregularity.

While the preferred embodiment of the present invention have been shown and described in conjunction with the accompanying drawings, the present invention is not limited thereto. It will be understood by those skilled in the art that various changes and modifications may be made without departing from the scope of the invention as defined in the following claims, and they are embraced in the technical scope of the present invention. Accordingly, the present invention may take various forms other than the specific embodiment as illustrated herein. For example, although the preferred embodiment has described the case where the protruded portions 22 of the substrate supporting surface 20 are cylindrical, they may have various shapes, e.g., a square pillar shape. Further, on the substrate supporting surface 20, an inner peripheral ring portion may be formed on an inner side of the peripheral ring portion 21. Both the high frequency power supply for generating the self-bias potential and a high frequency power supply for generating the plasma may be connected to the susceptor 13 serving as the lower electrode. Although the above-described preferred embodiment has described the case where the susceptor 13 having the substrate supporting surface 20 is included for the plasma processing apparatus 1 for performing the etching process, the substrate supporting member of the present invention can be applied to a plasma processing apparatus for performing a film forming process, or other substrate processing apparatuses in which the plasma is not used.

The present invention is useful for uniformly maintaining the in-surface temperature of the substrate in the substrate supporting member for controlling a temperature of the substrate.

While the invention has been shown and described with respect to the preferred embodiment, it will be understood by those skilled in the art that various changes and modifications may be made without departing from the scope of the invention as defined in the following claims.

What is claimed is:

1. A substrate supporting member for mounting and supporting a substrate on a substrate supporting surface thereof, and controlling a temperature of the substrate by thermal transfer between the substrate and the substrate supporting surface, comprising:
    an electrode layer; and
    an electrostatic chuck, positioned between the electrode layer and the substrate, and including the substrate supporting surface to support the substrate via a plurality of protruded portions each having an upper face configured to contact the substrate,
    wherein the plurality of protruded portions have gaps therebetween such that the substrate only contacts the substrate supporting member via the upper face of each of the protruded portions,
    wherein the substrate supporting surface is smaller than the substrate, and includes a central region, a peripheral region, and an intermediate region located between the central region and the peripheral region,
    wherein a number of the protruded portions per unit area of the peripheral region is greater than a number of the protruded portions per unit area of the central region such that a thermal conductivity between the substrate and the peripheral region is greater than a thermal conductivity between the substrate and the central region, and
    wherein the number of the protruded portions per unit area of the central region is greater than a number of the protruded portions per unit area of the intermediate region such that the thermal conductivity between the substrate and the central region is greater than a thermal conductivity between the substrate and the intermediate region.

2. The substrate supporting member of claim 1, wherein the intermediate region of the substrate supporting surface corresponds to an area ranging from 80% to 90% of a radius of the substrate from a center of the supported substrate.

3. The substrate supporting member of claim 2, wherein the thermal conductivities between the substrate and each of the central region, the peripheral region, and the intermediate region are controlled by changing a number of the protruded portions per unit area.

4. The substrate supporting member of claim 2, wherein the thermal conductivity between the substrate and the substrate supporting surface is controlled by changing a surface roughness of each of the central region, the peripheral region, and the intermediate region of the substrate supporting surface.

5. The substrate supporting member of claim 2, wherein the thermal conductivities between the substrate and each of the central region, the peripheral region, and the intermediate region are controlled by changing a contact area between the upper face of each of the protruded portions and the substrate.

6. The substrate supporting member of claim 1, wherein the thermal conductivities between the substrate and each of the central region, the peripheral region, and the intermediate region are controlled by changing a number of the protruded portions per unit area.

7. The substrate supporting member of claim 1, wherein the thermal conductivity between the substrate and the substrate supporting surface is controlled by changing a surface roughness of each of the central region, the peripheral region, and the intermediate region of the substrate supporting surface.

8. The substrate supporting member of claim 1, wherein the electrostatic chuck is made of a single material such that only the single material is positioned between the electrode layer and the substrate.

9. The substrate supporting member of claim 1, wherein the thermal conductivities between the substrate and each of the central region, the peripheral region, and the intermediate region are controlled by changing a contact area between the upper face of each of the protruded portions and the substrate.

10. A substrate processing apparatus, comprising:
    a substrate supporting member for mounting and supporting a substrate on a substrate supporting surface thereof, and controlling a temperature of the substrate by thermal transfer between the substrate and the substrate supporting surface, the substrate supporting member comprising an electrode layer and an electrostatic chuck, positioned between the electrode layer and the substrate, and including the substrate supporting surface to support the substrate via a plurality of protruded portions each having an upper face configured to contact the substrate, wherein the plurality of protruded portions have gaps therebetween such that the substrate only contacts the substrate supporting member via the upper face of each of the protruded portions, wherein the substrate supporting surface is smaller than the substrate, and includes a central region, a peripheral region, and an intermediate region located between the central region and the peripheral region, wherein a number of the protruded portions per unit area of the peripheral region is greater than a number of the protruded portions in per unit area of the central region such that a thermal conductivity between the substrate and the peripheral region is greater than a thermal conductivity between the substrate and the central region, wherein the number of the protruded portions per unit area of the central region is greater than a number of the protruded portions per unit area of the intermediate region such that the thermal conductivity between the substrate and the central region is greater than a thermal conductivity between the substrate and the intermediate region.

11. The substrate processing apparatus of claim 10, wherein the intermediate region of the substrate supporting surface corresponds to an area ranging from 80% to 90% of a radius of the substrate from a center of the supported substrate.

12. The substrate processing apparatus of claim 10, wherein the electrostatic chuck is made of a single material such that only the single material is positioned between the electrode layer and the substrate.

* * * * *